(12) United States Patent
Kudo et al.

(10) Patent No.: US 9,962,793 B2
(45) Date of Patent: May 8, 2018

(54) METHOD FOR PRODUCING DEPOSITION MASK

(71) Applicant: V TECHNOLOGY CO., LTD., Kanagawa (JP)

(72) Inventors: Syuji Kudo, Yokohama (JP); Yoshikatsu Yanagawa, Yokohama (JP); Takayuki Goto, Yokohama (JP)

(73) Assignee: V TECHNOLOGY CO., LTD. (JP)

( * ) Notice: Subject to any disclaimer, the term of this patent is extended or adjusted under 35 U.S.C. 154(b) by 212 days.

(21) Appl. No.: 14/744,748

(22) Filed: Jun. 19, 2015

(65) Prior Publication Data
US 2015/0283651 A1    Oct. 8, 2015

Related U.S. Application Data

(63) Continuation of application No. PCT/JP2013/078162, filed on Oct. 17, 2013.

(30) Foreign Application Priority Data

Dec. 21, 2012    (JP) .................................. 2012-279276

(51) Int. Cl.
*B23K 26/402*    (2014.01)
*B23K 26/08*    (2014.01)
(Continued)

(52) U.S. Cl.
CPC .......... *B23K 26/402* (2013.01); *B05C 21/005* (2013.01); *B23K 26/0869* (2013.01);
(Continued)

(58) Field of Classification Search
None
See application file for complete search history.

(56) References Cited

U.S. PATENT DOCUMENTS

| | | | | |
|---|---|---|---|---|
| 8,556,511 | B2* | 10/2013 | Von Oepen | A61F 2/82 384/114 |
| 9,334,556 | B2* | 5/2016 | Sugimoto | H01L 51/0011 |
| 2007/0278719 | A1* | 12/2007 | Adachi | B23K 26/0066 264/400 |

FOREIGN PATENT DOCUMENTS

| | | |
|---|---|---|
| JP | 07300664 | 11/1995 |
| JP | 2001237072 A | 8/2001 |

(Continued)

OTHER PUBLICATIONS

International Search Report for Application No. PCT/JP2013/078162 dated Jan. 21, 2014.

*Primary Examiner* — Benjamin A Schiffman
(74) *Attorney, Agent, or Firm* — Lerner, David, Littenberg, Krumholz & Mentlik, LLP (57) ABSTRACT

The invention provides a method for producing a deposition mask that includes forming of an opening pattern 1 at a predetermined position in a resin film 2 by laser processing so as to penetrate therethrough. The method including the steps of: forming a meniscus of a liquid film 14 between the resin film 2 and a smooth surface 13b of a reference substrate 13 supporting the resin film 2; and after the resin film 2 and the reference substrate 13 are brought into close contact with an adsorption force generated by Laplace pressure, forming the opening pattern 1 by performing the laser processing. Accordingly, it is possible to increase the speed of the laser processing without generating a burr on an edge portion of the opening pattern.

4 Claims, 7 Drawing Sheets

(51) Int. Cl.
*C23C 14/04* (2006.01)
*B05C 21/00* (2006.01)
*B23K 26/382* (2014.01)
*B23K 103/00* (2006.01)

(52) U.S. Cl.
CPC .......... *B23K 26/382* (2015.10); *C23C 14/042* (2013.01); *B23K 2203/42* (2015.10); *B23K 2203/50* (2015.10)

(56) References Cited

FOREIGN PATENT DOCUMENTS

| | | | |
|---|---|---|---|
| JP | 2004190057 | A | 7/2004 |
| JP | 2008121060 | A | 5/2008 |
| JP | 2012077328 | A | 4/2012 |
| JP | 2013095992 | A | 5/2013 |
| JP | 2013108143 | A | 6/2013 |
| JP | 2013165058 | A | 8/2013 |
| WO | 2013039196 | A1 | 3/2013 |

\* cited by examiner

METHOD FOR PRODUCING DEPOSITION MASK

CROSS-REFERENCE TO RELATED APPLICATIONS

The present application is a continuation of International Application No. PCT/JP2013/078162, filed on Oct. 17, 2013, which claims priority from Japanese Patent Application No. 2012-279276, filed on Dec. 21, 2012, the disclosures of which are hereby incorporated herein by reference.

BACKGROUND OF THE INVENTION

1. Field of the Invention

The present invention relates to a method for producing a deposition mask, that includes forming of an opening pattern at a predetermined position in a resin film by laser processing so as to penetrate therethrough, and more particularly, relates to a method for producing a deposition mask enabling high-speed laser processing.

2. Description of Related Art

In conventional methods for producing a deposition mask, a first resist pattern having a plurality of openings is formed on a metal plate, an etching process is performed via the openings of the first resist pattern to form a plurality of opening patterns on the metal plate, the opening patterns penetrating through the metal plate, the first resist pattern is then removed, a second resist pattern having a plurality of second openings, through each of which a metal edge portion having a predetermined width around the corresponding opening pattern is exposed, is formed on the metal plate, an etching process is performed via the second openings of the second resist pattern, to form a mask main body portion around the plurality of openings and a peripheral portion having a thickness greater than that of the mask main body portion and positioned around the mask main body portion, and then the second resist pattern is removed (for example, see Japanese Patent Application Laid-open Publication No. 2001-237072).

However, in such conventional methods for producing a deposition mask, the plurality of opening patterns is formed on the metal plate so as to penetrate through the metal plate, by subjecting the metal plate to a wet etching process. Accordingly, highly precise opening patterns cannot be accurately formed by isotropic etching in the wet etching. Particularly, for example, in a case of a deposition mask for an organic EL display panel having a large area with a side length of tens of centimeters, opening patterns of the entire mask surface cannot be uniformly formed due to the generation of etching unevenness.

The inventors suggest a composite-type deposition mask having a structure in which a resin film having opening patterns which are formed corresponding to thin film patterns to be deposited on a substrate and have the same shape and dimensions as those of the thin film pattern, and a thin plate-shaped magnetic metal member having through holes formed to include the opening patterns therein are brought into close contact with each other.

The composite-type deposition mask is a deposition mask in which opening patterns are formed by laser processing on a thin resin film having a thickness of approximately 10 μm to 30 μm. It has advantages in that highly precise opening patterns can be accurately formed and the opening patterns can be uniformly formed over the entire mask surface even in a case of a deposition mask having a large area as described above.

In order to increase the speed of laser processing, increasing a laser output is effective. However, when the laser output is increased, the intensity distribution of laser beams becomes non-uniform, and due to the non-uniformity of the intensity distribution, the frequency of generation of a cutting remainder (hereinafter, referred to as "burr") on an edge portion of an opening pattern is increased.

There is a concern that the burr may form a shadow of the deposition and thereby cause shape disorder of the edge portion of the thin film pattern to be formed by deposition, or the burr may form a gap between the deposition mask and the substrate for film deposition, and thus a film deposition material may easily enter into a portion below the mask, so that the area of the thin film pattern may be increased.

As a measure for avoiding this problem, a method including: forming a hole portion having a thin layer remaining in a bottom portion thereof by laser processing; and then penetrating the bottom portion of the hole portion by etching, is also considered, but there is a concern that the process of producing a deposition mask may be made complicated.

SUMMARY OF THE INVENTION

An object of the invention is to deal with the problem and to provide a method for producing a deposition mask enabling high-speed laser processing without generating a burr on an edge portion of an opening pattern.

In order to achieve the object, a method for producing a deposition mask according to an aspect of the invention is a method for producing a deposition mask, that includes forming of an opening pattern at a predetermined position in a resin film by laser processing so as to penetrate therethrough. The method includes the steps of: forming a meniscus of a liquid film between the resin film and a smooth surface of a support substrate supporting the resin film; and after the resin film and the support substrate are brought into close contact with an adsorption force generated by Laplace pressure, forming the opening pattern by performing laser processing.

According to the aspect of the invention, it is possible to prevent the generation of a cutting remainder (burr) of laser processing in an edge portion of an opening pattern by interposing a liquid film between a resin film and a support substrate. Accordingly, it is possible to form opening patterns having a specified shape. Thus, it is possible to form highly precise thin film patterns.

BRIEF DESCRIPTION OF THE DRAWINGS

FIGS. 2A and 2B are diagrams illustrating an example of the configuration of a deposition mask produced using the method according to the embodiment of the invention.

FIGS. 6A and 6B are explanatory views illustrating the effect of the improvement in the opening pattern forming process in the method for producing a deposition mask according to the embodiment of the invention.

DESCRIPTION OF PREFERRED EMBODIMENTS

Figure 1:
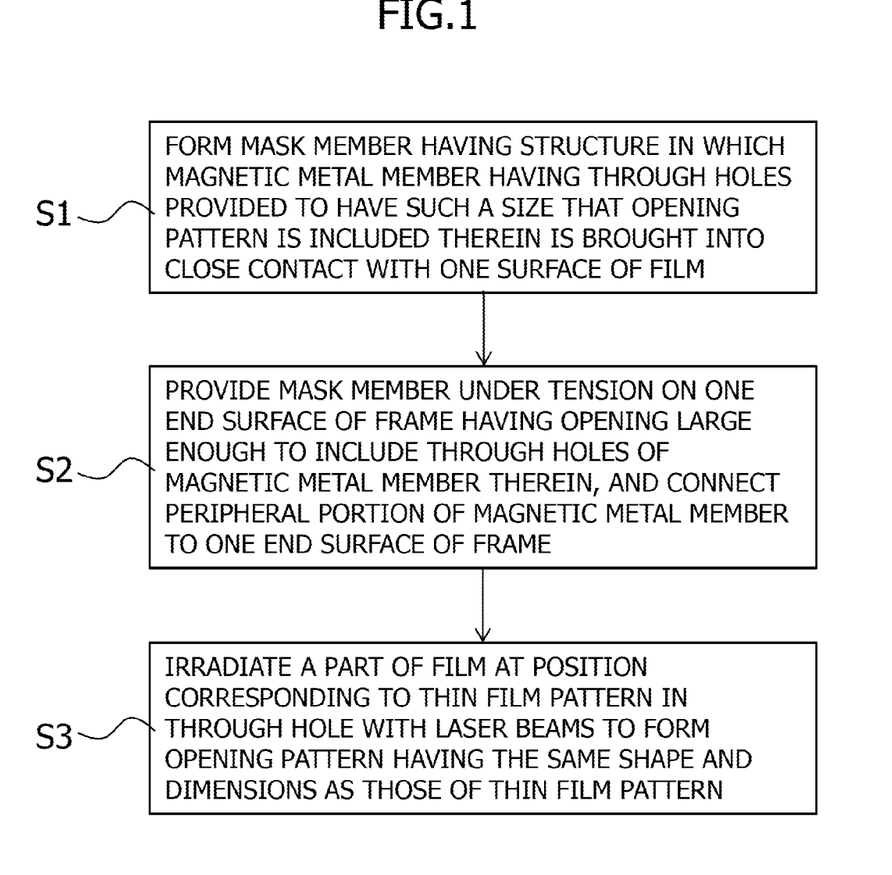
FIG. 1 is a flowchart illustrating a method for producing a deposition mask according to an embodiment of the invention.

Hereinafter, an embodiment of the invention will be described in detail with reference to the accompanying drawings. FIG. 1 is a flowchart illustrating a method for producing a deposition mask according to an embodiment of the invention. In this method for producing a deposition mask, an opening pattern is formed at a predetermined position in a resin film by laser processing so as to penetrate therethrough, and Step S1 for forming a mask member, Step S2 for connecting a frame, and Step S3 for forming opening patterns are included.

Figure 2A:
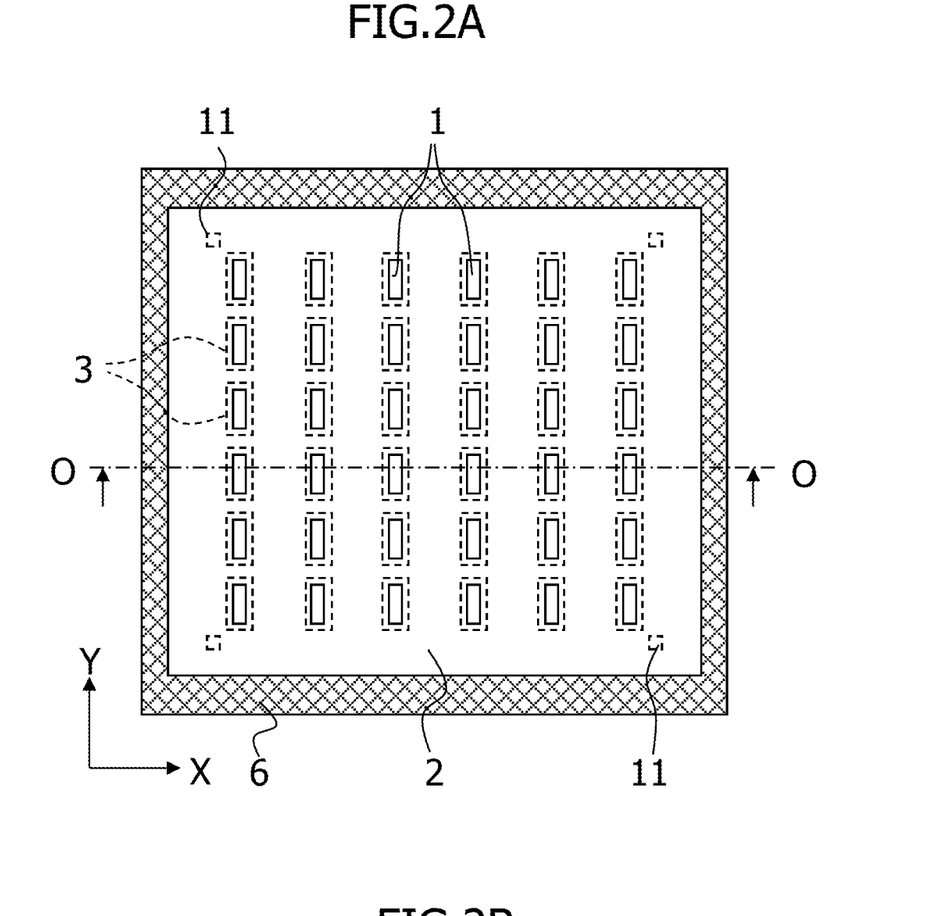
FIG. 2A is a bottom view.
Figure 2B:
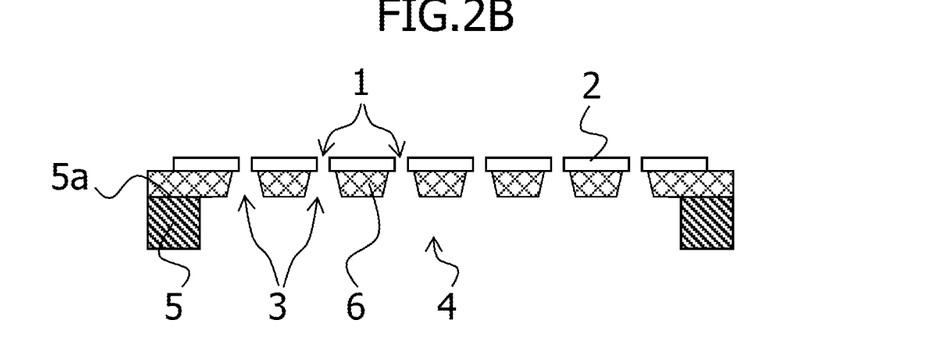
FIG. 2B is a view taken along line O-O viewed from arrows of FIG. 2A.

Here, as an example, what is described is a method for producing a deposition mask having a structure in which, as illustrated in FIG. 2A and 2B, one surface of a resin film having a plurality of opening patterns 1 penetrating therethrough and formed at positions corresponding to a plurality of thin film patterns to be formed, the opening patterns 1 having the same shape and dimensions as those of the thin film pattern is brought into close contact with a thin plate-shaped magnetic metal member 6 having a plurality of through holes 3 each formed to have such a size that the opening pattern 1 is included therein, and an end surface 5a of a frame 5 having an opening 4 large enough to include the plurality of through holes 3 therein is connected to a peripheral portion of a surface opposite the surface of the magnetic metal member 6 brought into close contact with the resin film 2.

This Step S1 is a process of forming a mask member 10 having a structure in which the magnetic metal member 6 having the through holes 3 each provided to have such a size that the opening pattern 1 is included therein is brought into close contact with one surface of the resin film 2. Hereinafter, a detailed description will be given with reference to FIG. 3A to 3C.

Figure 3A:
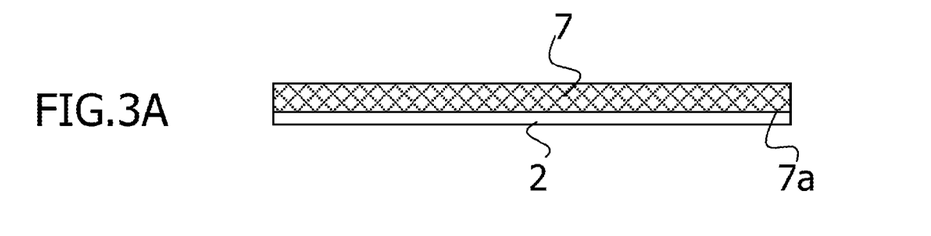
FIGS. 3A to 3C are explanatory cross-sectional views illustrating a process of forming a mask member in the method for producing a deposition mask according to the embodiment of the invention.

First, as illustrated in FIG. 3A, a magnetic metal sheet 7 composed of a magnetic metal material formed of, for example, nickel, a nickel alloy, an Invar, or an Invar alloy, and having a thickness of approximately 30 μm to 50 μm is cut in accordance with a surface area of a substrate that is a film deposition target, and a resin liquid such as polyimide or polyethylene terephthalate (PET) is applied and dried on one surface 7a of the magnetic metal sheet 7, to form a visible light-transmissive resin film 2 having a thickness of approximately 10 μm to 30 μm.

Figure 3B:
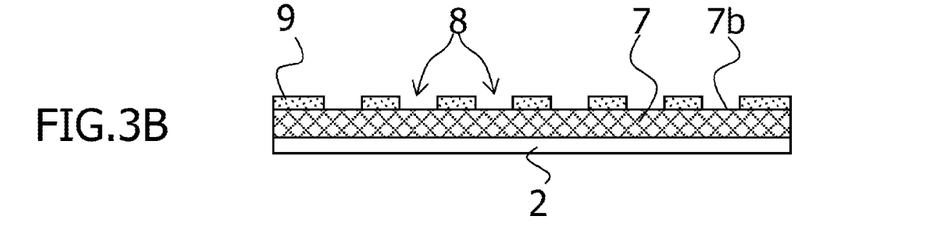

Next, as illustrated in FIG. 3B, a resist is, for example, applied by spraying on the other surface 7b of the magnetic metal sheet 7, and then dried to form a resist film. Then, the resist film is exposed using a photomask, and then developed to form a resist mask 9 having, at positions corresponding to a plurality of thin film patterns, a plurality of openings 8 having a greater shape and greater dimensions than those of the thin film pattern.

Figure 3C:
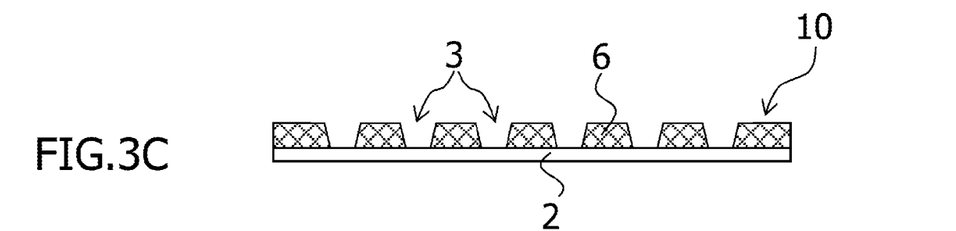

Then, as illustrated in FIG. 3C, the magnetic metal sheet 7 is subjected to wet etching using the resist mask 9, and the magnetic metal sheet 7 in parts corresponding to the openings 8 of the resist mask 9 are removed to provide through holes 3 to thus form a magnetic metal member 6. Thereafter, the resist mask 9 is removed by being dissolved in, for example, an organic solvent. Accordingly, the mask member 10 in which the magnetic metal member 6 and the resin film 2 are brought into close contact, is formed. An etchant for subjecting the magnetic metal sheet 7 to wet etching can be appropriately selected in accordance with the material of the magnetic metal sheet 7 to be used, and a known technique can be applied.

In addition, when the through holes 3 are formed by subjecting the magnetic metal sheet 7 to wet etching, mask-side alignment marks 11 (see FIG. 2A) for alignment with respect to substrate-side alignment marks provided in advance in the substrate may be simultaneously formed at predetermined positions outside the region in which the plurality of through holes 3 is formed. In this case, when the resist mask 9 is formed, openings for an alignment mark may be provided at positions corresponding to the mask-side alignment marks 11.

The above-described Step S2 is a process of providing the mask member 10 under tension on one end surface 5a of the frame 5 formed of an Invar, an Invar alloy, or the like, having the opening 4 large enough to include the plurality of through holes 3 of the magnetic metal member 6 therein, and then connecting a peripheral portion of the magnetic metal member 6 to the one end surface 5a of the frame 5. Hereinafter, a detailed description will be given with reference to FIG. 4A to 4C.

Figure 4A:
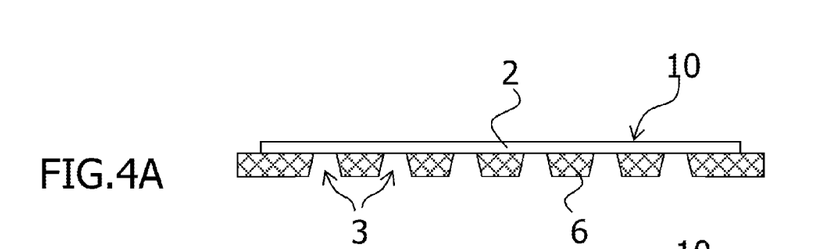
FIGS. 4A to 4C are explanatory cross-sectional views illustrating a frame connection process in the method for producing a deposition mask according to the embodiment of the invention.

First, as illustrated in FIG. 4A, a part of the resin film 2 corresponding to the peripheral portion of the magnetic metal member 6 is irradiated with laser beams L having a wavelength of 400 nm or less using, for example, a KrF excimer laser (248 nm) or third or fourth-order harmonics of a YAG laser, and the resin film 2 in the above part is removed by ablation.

Figure 4B:
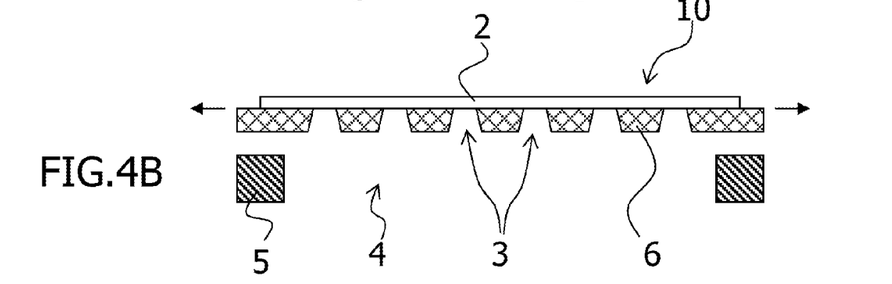

Next, as illustrated in FIG. 4B, the mask member 10 is positioned above the frame 5 in a state in which a tension having such an amount that the mask member 10 is not bent is applied to a side (direction of the arrows) parallel to the surface of the mask member 10.

Figure 4C:
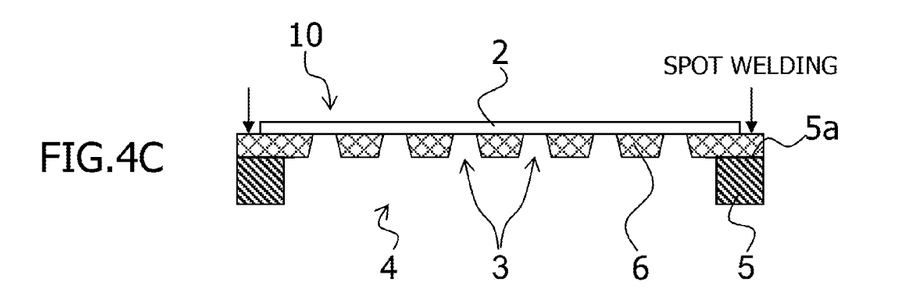

As illustrated in FIG. 4C, the mask member 10 is provided under tension on the one end surface 5a of the frame 5 in a state in which a tension is applied to a side parallel to the surface of the mask member 10, and the peripheral portion of the magnetic metal member 6 and the frame 5 are spot-welded.

The above-described Step S3 is a process of irradiating a part of the resin film 2 at a position corresponding to the thin film pattern in the through hole 3 with laser beams L, so as to form an opening pattern 1 having the same shape and dimensions as those of the thin film pattern. Hereinafter, a detailed description will be given with reference to FIG. 5A to 5C.

Figure 5A:
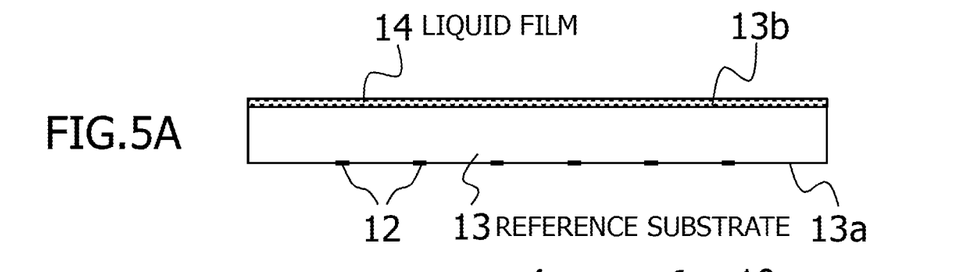
FIGS. 5A to 5C are explanatory cross-sectional views illustrating an opening pattern forming process in the method for producing a deposition mask according to the embodiment of the invention.

First, as illustrated in FIG. 5A, for example, water or a low-molecular organic solvent such as acetone, isopropyl alcohol (IPA) or ethanol is applied by, for example, spraying on a smooth surface 13b of a reference substrate (support substrate) 13 having reference patterns 12, which are irradiation targets of laser beams L, formed at positions corresponding to the thin film pattern to be formed, opposite a surface 13a having the reference patterns 12 formed thereon, and thus a liquid film 14 having a thickness of tens of micrometers to hundreds of micrometers is formed. A highmolecular material may also be used as the liquid film 14. However, in a case of a low-molecular material, the amount of residue generated by ablation with the irradiation of laser beams L is less, and thus the deposition mask after the completion can be easily washed.

Figure 5B:
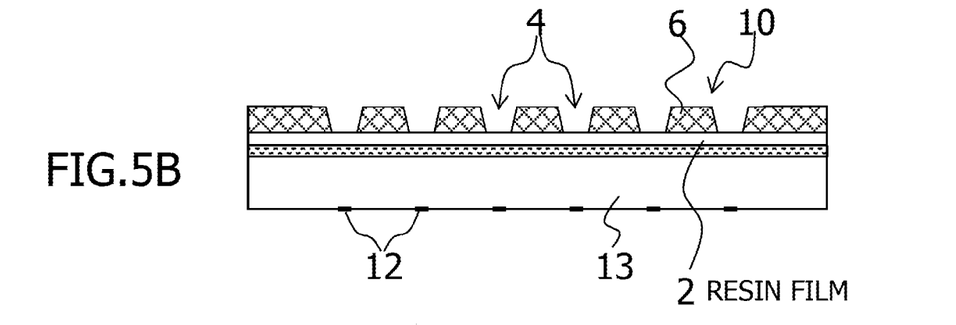

Next, as illustrated in FIG. 5B, the mask member 10 is placed on the liquid film 14 coated on the reference substrate 13, facing the film 2 side of the mask member 10 downward. At this time, bubble entrainment can be reduced when the mask member 10 is gradually brought into contact with the liquid film 14 from one end to the other end of the mask member 10. When bubbles remain in the liquid film 14, the mask member 10 may be pressed from a center portion of the magnetic metal member 6 to the outside using a roller to remove the bubbles from the liquid film 14. Accordingly, a meniscus of the liquid film 14 is formed between the resin film 2 and the smooth surface 13b of the reference substrate 13 supporting the resin film 2, and therefore the resin film 2 and the reference substrate 13 can be brought into close contact with an adsorption force generated by Laplace pressure.

Figure 5C:
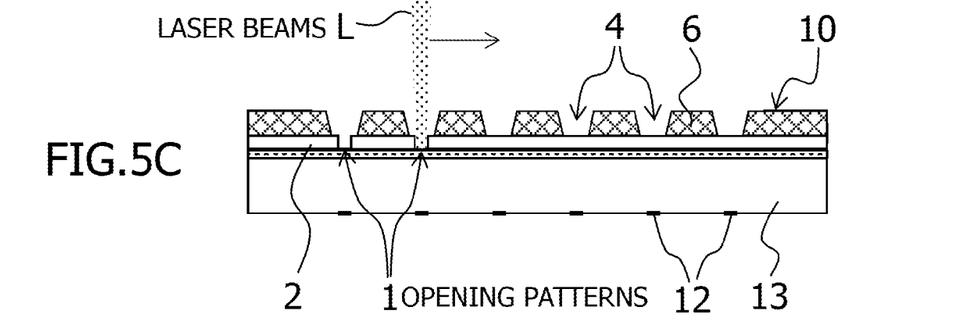

As illustrated in FIG. 5C, with relative step-movement of the reference substrate 13 and the laser irradiation device in two-dimensional directions of X and Y in a surface parallel to the surface of the reference substrate 13, for example, a reference pattern 12 of the reference substrate 13 is irradiated with laser beams L of a KrF excimer laser (248 nm) or third or fourth-order harmonics of a YAG laser having an energy density of 1 J/cm$^2$ to 20 J/cm$^2$ and shaped so that the irradiation area is the same as the area of the thin film pattern, and opening patterns 1 are formed by ablation of the resin film 2. In this case, the opening pattern 1 may be formed with a plurality of shots of laser irradiation.

Figure 6A:
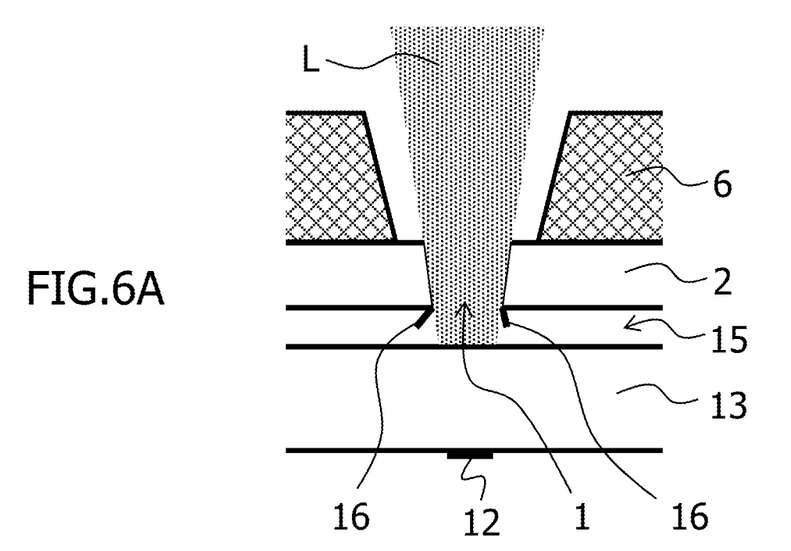
FIG. 6A illustrates a state before the improvement and FIG. 6B illustrates a state after the improvement.
Figure 6B:
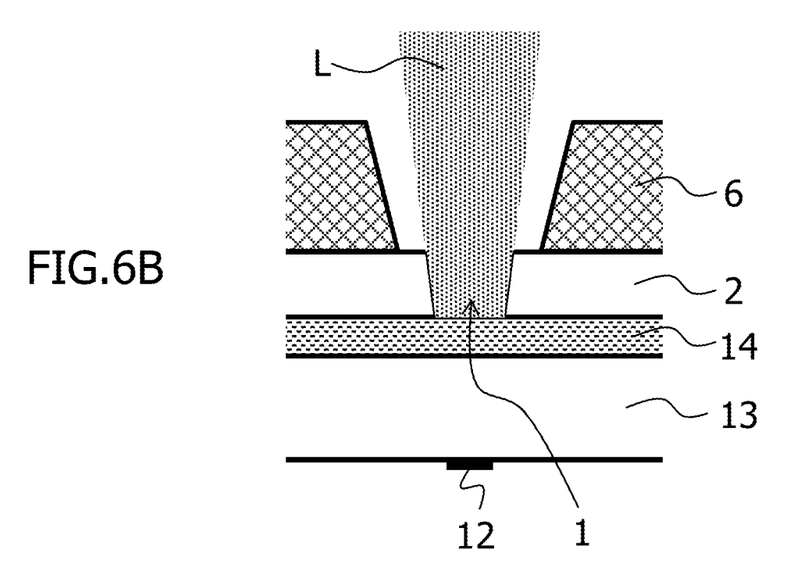

Here, when a gap 15 exists between the resin film 2 and the reference substrate 13 as described above, burrs 16 generated in the edge portion of the opening pattern 1 are bent toward the gap 15 due to the processing shock caused by the applied laser beams L as illustrated in FIG. 6A, and some of them are bent so that those are positioned below the resin film 2 outside the opening pattern 1. Therefore, these may remain without being removed by subsequent irradiation of laser beams L. However, according to the method of the embodiment, as illustrated in FIG. 6B, the liquid film 14 exists between the resin film 2 and the reference substrate 13, and thus even when burrs 16 are generated, the burrs 16 are not bent, but remain at the same positions. Accordingly, the burrs 16 can be removed by subsequent irradiation of laser beams L and opening patterns 1 having a specified shape can be formed.

When all of the opening patterns 1 are formed in this manner, a solvent such as hydrofluoroether (HFE) having a lower surface tension than that of the liquid film 14 is applied on the upper surface of the magnetic metal member 6 and is permeated into the liquid film 14 through the opening patterns 1. Accordingly, the adsorption force of the liquid film 14 generated by Laplace pressure is reduced, and thus the deposition mask floats above the liquid film 14 and is easily peeled from the reference substrate 13.

Figure 7:
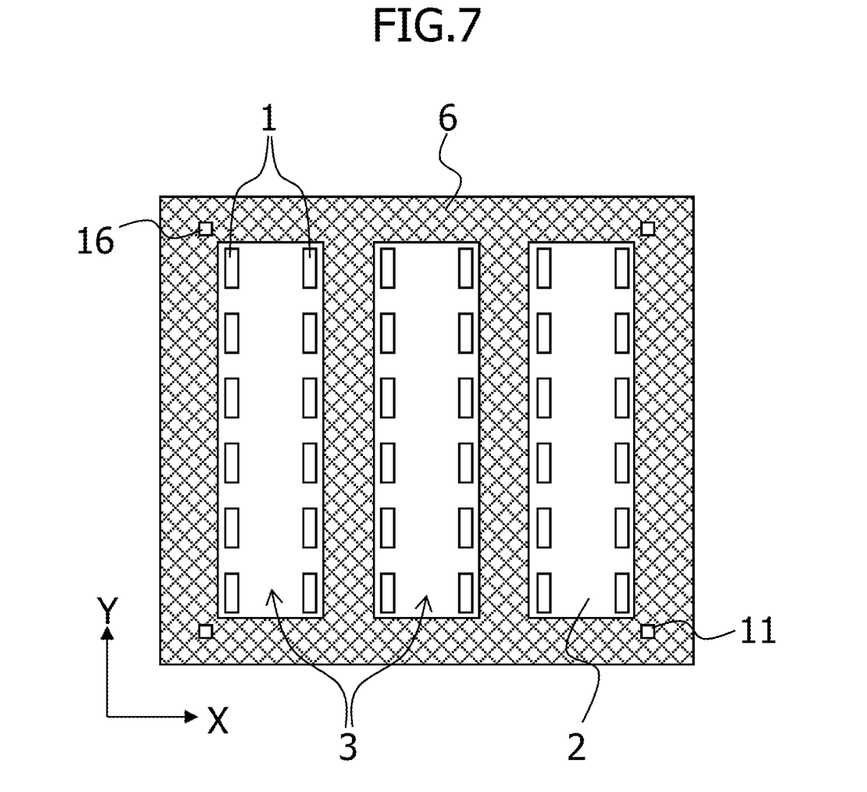
FIG. 7 is a plan view illustrating another example of the configuration of the deposition mask produced using the method according to the embodiment of the invention.

The deposition mask illustrated in FIG. 2A and 2B associated with the method of the embodiment is produced by executing the above Steps S1 to S3. Regarding the deposition mask illustrated in FIG. 2A and 2B, the case in which one opening pattern 1 exists in one through hole 3 has been described, but is not limited thereto. A plurality of opening patterns 1 may exist in one through hole 3 as illustrated in FIG. 7.

In the embodiment, the case in which Step S1 for forming the mask member 10 is followed by connecting of the frame 5, has been described, but is not limited thereto. Step S1 may be followed by forming of the opening patters 1 by laser processing, and then the frame 5 may be connected.

In the foregoing, the method for producing a deposition mask having a structure in which the frame 5 is connected, has been described, but a deposition mask to be produced using the method according to the embodiment may have no frame 5. Furthermore, the deposition mask may have only the resin film 2 without being in close contact with the magnetic metal member 6.

It should be noted that the entire contents of Japanese Patent Application No. 2012-279276, filed on Dec. 21, 2012, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:

1. A method for producing a deposition mask, the method comprising:
    forming an opening pattern at a predetermined position in a resin film by laser processing so as to penetrate therethrough, the forming of the opening pattern comprising the steps of:
        forming a liquid film between the resin film and a smooth surface of a support substrate supporting the resin film to bring the resin film and the smooth surface into close contact with each other; and
        forming the opening pattern on the resin film by performing the laser processing;
    after the forming of the opening pattern, causing a solvent to be permeated into the liquid film through the opening pattern, the solvent having a lower surface tension than the liquid film.

2. The method for producing the deposition mask according to claim 1, wherein the support substrate is a transparent substrate having, on either a front surface or a rear surface thereof, a reference mark as a laser beam irradiation target formed corresponding to a position in which the opening pattern is formed.

3. The method for producing the deposition mask according to claim 1, wherein the liquid film is water or a low-molecular organic solvent.

4. The method for producing the deposition mask according to claim 1, wherein a magnetic metal member having a through hole provided to have such a size that the opening pattern is included therein, has been brought into close contact in advance with the resin film.

* * * * *